United States Patent
Chang et al.

(10) Patent No.: US 10,892,348 B2
(45) Date of Patent: Jan. 12, 2021

(54) METHOD OF ROUNDING FIN-SHAPED STRUCTURE

(71) Applicant: UNITED MICROELECTRONICS CORP., Hsin-Chu (TW)

(72) Inventors: Hao-Hsuan Chang, Kaohsiung (TW); Bin-Siang Tsai, Changhua County (TW); Ting-An Chien, Tainan (TW); Yi-Liang Ye, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/396,788

(22) Filed: Apr. 29, 2019

(65) Prior Publication Data

US 2020/0343371 A1  Oct. 29, 2020

(51) Int. Cl.
  *H01L 29/66*  (2006.01)
  *H01L 21/62*  (2006.01)
  *H01L 21/02*  (2006.01)
  *H01L 21/265*  (2006.01)
  *H01L 21/308*  (2006.01)
  *H01L 21/762*  (2006.01)
  *H01L 29/78*  (2006.01)

(52) U.S. Cl.
  CPC .... *H01L 29/66795* (2013.01); *H01L 21/0228* (2013.01); *H01L 21/02236* (2013.01); *H01L 21/26513* (2013.01); *H01L 21/308* (2013.01); *H01L 21/76224* (2013.01); *H01L 29/7854* (2013.01)

(58) Field of Classification Search
  CPC .................................................. H01L 29/7854
  See application file for complete search history.

(56) References Cited

U.S. PATENT DOCUMENTS

| | | | | |
|---|---|---|---|---|
| 4,830,974 A | * | 5/1989 | Chang | H01L 27/105 257/316 |
| 6,355,532 B1 | * | 3/2002 | Seliskar | B82Y 10/00 257/E21.404 |
| 8,853,013 B2 | | 10/2014 | Tsai | |
| 9,117,906 B2 | | 8/2015 | Fumitake | |
| 9,595,612 B2 | | 3/2017 | Kim | |
| 9,786,510 B2 | | 10/2017 | Shen | |

(Continued)

OTHER PUBLICATIONS

Pauline Stevic "BOE/HF-Silicon Dioxide Etching Standard Operating Procedure" Kavli Nanolab Delft, Jul. 19, 2018 (Year: 2018).*

*Primary Examiner* — John A Bodnar
(74) *Attorney, Agent, or Firm* — Winston Hsu

(57) ABSTRACT

A method of rounding fin-shaped structures includes the following steps. A substrate including fin-shaped structures, and pad oxide caps and pad nitride caps covering the fin-shaped structures from bottom to top are provided. An isolation structure fills between the fin-shaped structures. A removing process is performed to remove a top part of the isolation structure and expose top parts of the fin-shaped structures. An oxidation process is performed to oxidize sidewalls of the top parts of the fin-shaped structures, thereby forming oxidized parts covering sidewalls of the top parts of the fin-shaped structures. The pad nitride caps are removed. The pad oxide caps and the oxidized parts are removed at the same time, thereby forming rounding fin-shaped structures.

13 Claims, 5 Drawing Sheets

(56) References Cited

U.S. PATENT DOCUMENTS

2004/0115898 A1* 6/2004 Moghadam .......... H01L 21/022
  438/435
2007/0102756 A1* 5/2007 Lojek ................ H01L 29/66795
  257/327

* cited by examiner

METHOD OF ROUNDING FIN-SHAPED STRUCTURE

BACKGROUND OF THE INVENTION

1. Field of the Invention

The present invention relates generally to a method of manufacturing fin-shaped structures, and more specifically to a method of rounding fin-shaped structures.

2. Description of the Prior Art

With increasing miniaturization of semiconductor devices, various multi-gate MOSFET devices have been developed. The multi-gate MOSFET is advantageous for the following reasons. First, manufacturing processes of multi-gate MOSFET devices can be integrated into traditional logic device processes, and thus are more compatible. In addition, since the three-dimensional structure of the multi-gate MOSFET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased.

SUMMARY OF THE INVENTION

The present invention provides a method of rounding fin-shaped structures, which rounds fin-shaped structures by oxidation, and enhances device reliability.

The present invention provides a method of rounding fin-shaped structures including the following steps. A substrate including fin-shaped structures, and pad oxide caps and pad nitride caps covering the fin-shaped structures from bottom to top are provided. An isolation structure fills between the fin-shaped structures. A removing process is performed to remove a top part of the isolation structure and expose top parts of the fin-shaped structures. An oxidation process is performed to oxidize sidewalls of the top parts of the fin-shaped structures, thereby forming oxidized parts covering the sidewalls of the top parts of the fin-shaped structures. The pad nitride caps are removed. The pad oxide caps and the oxidized parts are removed at the same time, thereby forming rounding fin-shaped structures.

According to the above, the present invention provides a method of rounding fin-shaped structures, which provides pad oxide caps and pad nitride caps covering fin-shaped structures from bottom to top, fills an isolation structure between the fin-shaped structures, performs a removing process to remove a top part of the isolation structure and expose top parts of the fin-shaped structures, performs an oxidation process to oxidize sidewalls of the top parts of the fin-shaped structures, thereby forming oxidized parts covering the sidewalls of the top parts of the fin-shaped structures, removes the pad nitride caps, and removes the pad oxide caps and the oxidized parts at the same time, thereby rounding the fin-shaped structures. Thus, layers, especially for a work function metal layer, covering the rounding fin-shaped structures can be uniform, hence decreasing the tip/point effect and enhancing device reliability.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
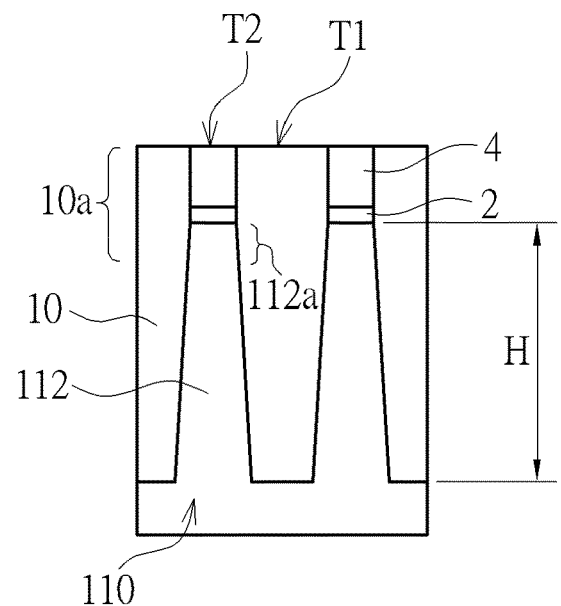
FIGS. 1-6 schematically depict cross-sectional views of a method of rounding fin-shaped structures according to a first embodiment of the present invention.

FIGS. 1-6 schematically depict cross-sectional views of a method of rounding fin-shaped structures according to a first embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. For illustrating the present invention clearly, there are only one area depicted in this embodiment, wherein the area may be a low voltage threshold (LVT) area, a high voltage threshold (HVT) area or etc, but the present invention can also be applied to two or more areas at the same time, depending upon practical requirements.

The substrate 110 includes two fin-shaped structures 112, and pad oxide caps 2 and pad nitride caps 4 cover the fin-shaped structures 112 from bottom to top. Only two fin-shaped structures 112 are depicted in this embodiment, and the two fin-shaped structures 112 have same heights H, but the present invention is not restricted thereto.

More precisely, the method of forming the two fin-shaped structures 112 may include, but is not limited to, the following steps. A bulk bottom substrate (not shown) is provided. A pad oxide layer (not shown) and a pad nitride layer (not shown) may be sequentially formed on the bulk bottom substrate (not shown) and are patterned to define the location of the two fin-shaped structures 112 in the bulk bottom substrate (not shown) by methods such as a sidewall image transfer process, therefore the pad oxide caps 2 and the pad nitride caps 4 being formed. An etching process is performed to form the two fin-shaped structures 112 by serving the pad oxide caps 2 and the pad nitride caps 4 as hard masks. Thereby, the two fin-shaped structures 112 located in the substrate 110 are then formed completely. Meanwhile, the pad oxide caps 2 and the pad nitride caps 4 cover the fin-shaped structures 112 from bottom to top.

In this embodiment, the pad oxide caps 2 and the pad nitride caps 4 would be removed in later processes, and a tri-gate MOSFET can be formed in the following processes. There are three contact faces between the two fin-shaped structures 112 and the following formed dielectric layer functions as a carrier channel whose width is wider than a channel width in a conventional planar MOSFET. When a driving voltage is applied, the tri-gate MOSFET produces a double on-current compared to the conventional planar MOSFET.

The present invention can also be applied to other semiconductor substrates. For example, a silicon-on-insulator substrate (not shown) is provided, and then a single crystalline silicon layer being a top part of the silicon-oninsulator substrate (not shown) is etched till an oxide layer being a middle part of the silicon-on-insulator substrate (not shown) is exposed.

An isolation structure 10 fills between the fin-shaped structures 112. The isolation structure 10 may be a shallow trench isolation (STI) structure, and may include oxide, which may be formed by a high-density plasma chemical vapor deposition (HDPCVD) process or a flowable chemical vapor deposition (FCVD) process, but it is not limited thereto. In this embodiment, a top surface T1 of the isolation structure 10 is trimmed with top surfaces T2 of the pad nitride caps 4, which may be carried out by filling and planarizing the isolation structure 10, but it is not limited thereto.

Figure 2:
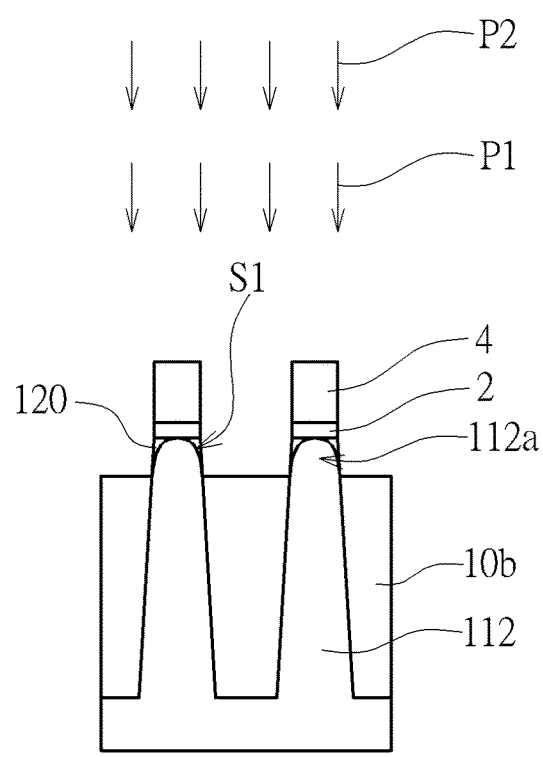

Then, a removing process P1 is performed to remove a top part 10a of the isolation structure 10 and expose top parts 112a of the fin-shaped structures 112 by serving the pad nitride caps 4 as hard masks, therefore an isolation structure 10b being formed, as shown in FIG. 2. The removing process P1 may be a chemical oxide remove process while the isolation structure 10 is a shallow trench isolation (STI) structure, but it is not limited thereto. Thereafter, an oxidation process P2 is performed to oxidize sidewalls S1 of the top parts 112a of the fin-shaped structures 112, and thus oxidized parts 120 covering the sidewalls S1 of the top parts 112a of the fin-shaped structures 112 are formed. Hence, tips of the top parts 112a of the fin-shaped structures 112 can be rounded. This decreases the tip/point effect, improves thickness uniformity of a later covering work function layer, and enhances device reliability.

Preferably, the oxidation process P2 includes an $O_2$ treatment process or an in situ steam generation (ISSG) process, but it is not limited thereto. Still preferably, the oxidation process P2 is an in situ steam generation (ISSG) process for forming oxidized parts 120 on the sidewalls S1 of the top parts 112a of the fin-shaped structures 112 easily. The thickness of each of the oxidized parts 120 is preferably 7-10 angstroms to round the top parts 112a of the fin-shaped structures 112 efficiently.

Figure 3:
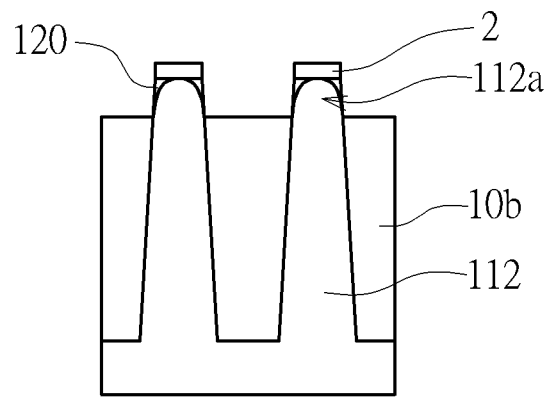
Figure 4:
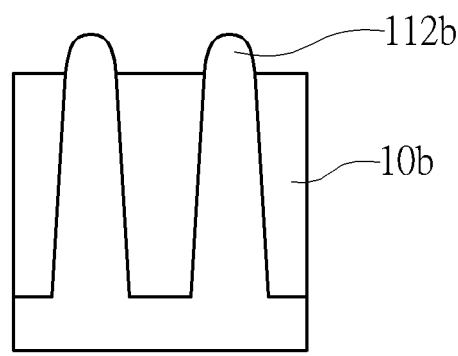

Then, the pad nitride caps 4 are removed by a process such as a chemical nitride remove process, and the pad oxide caps 2 are exposed, as shown in FIG. 3. Thereafter, the pad oxide caps 2 and the oxidized parts 120 are removed at the same time, thereby forming rounding fin-shaped structures 112b, as shown in FIG. 4. That is, the oxidized parts 120 round the profiles of the fin-shaped structures 112 of FIG. 1. The top parts 112a of the fin-shaped structures 112 of FIG. 1 are rounded because of the oxidation process P2 is performed in the step of FIG. 2. Since the pad oxide caps 2 and the oxidized parts 120 are composed of oxide, the pad oxide caps 2 and the oxidized parts 120 may be removed by a chemical oxide remove process, but it is not limited thereto. Because of the rounding fin-shaped structures 112b being formed, thicknesses of layers covering the rounding fin-shaped structures 112b such as a gate (especially for a work function metal layer of the gate) in following steps can be uniform. This decreases the tip/point effect and improves device reliability.

Figure 5:
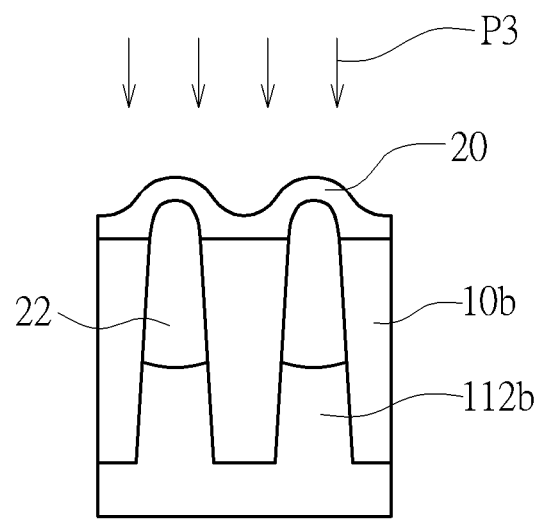

As shown in FIG. 5, an oxide layer 20 may be formed to conformally cover the isolation structure 10b and the rounding fin-shaped structures 112b. An implantation process P3 is then performed to form wells 22 in the rounding fin-shaped structures 112b by serving the oxide layer 20 as a protecting layer. The oxide layer 20 is preferably formed by an atomic layer deposition process to have enough thicknesses for protecting.

Figure 6:
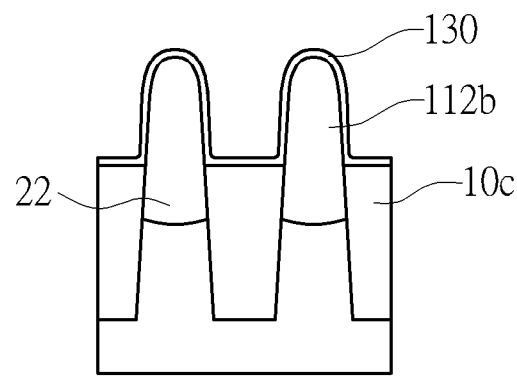

Thereafter, the oxide layer 20 is removed right after the implantation process is performed, as shown in FIG. 6. Then, the isolation structure 10b of FIG. 5 is etched back to form an isolation structure 10c, and a gate 130 is disposed over the rounding fin-shaped structures 112b protruding from the isolation structure 10c. As the gate 130 is a metal gate, the gate 130 may include a work function metal layer, a barrier layer and a low resistivity material etc, but it is not limited thereto.

Figure 7:
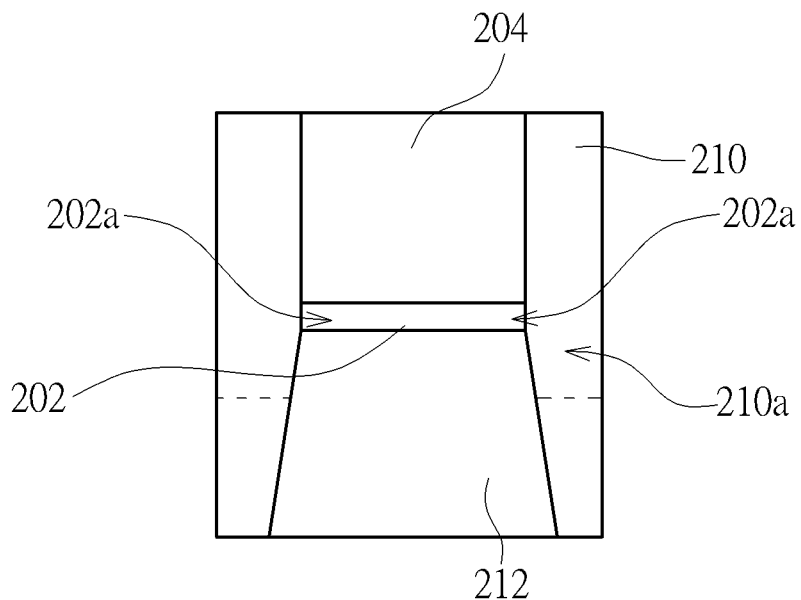
FIGS. 7-10 schematically depict cross-sectional views of a method of rounding fin-shaped structures according to a second embodiment of the present invention.

FIGS. 1-6 depict an embodiment that only the sidewalls S1 of the top parts 112a of the fin-shaped structures 112 are oxidized. FIGS. 7-10 depict another preferred embodiment that not only sidewalls of top parts of fin-shaped structures are oxidized, but also partial top surfaces of the top parts of the fin-shaped structures are oxidized. In this embodiment, only one fin-shaped structure is depicted for simplifying the present invention, but the present invention is not restricted thereto. As shown in FIG. 7, a pad oxide cap 202 and a pad nitride cap 204 cover a fin-shaped structure 212 from bottom to top, and an isolation structure 210 fills beside the fin-shaped structure 212. Methods of forming the fin-shaped structure 212, the pad oxide cap 202, the pad nitride cap 204 and isolation structure 210 are common to the embodiment of FIGS. 1-6, and are not described.

Figure 8:
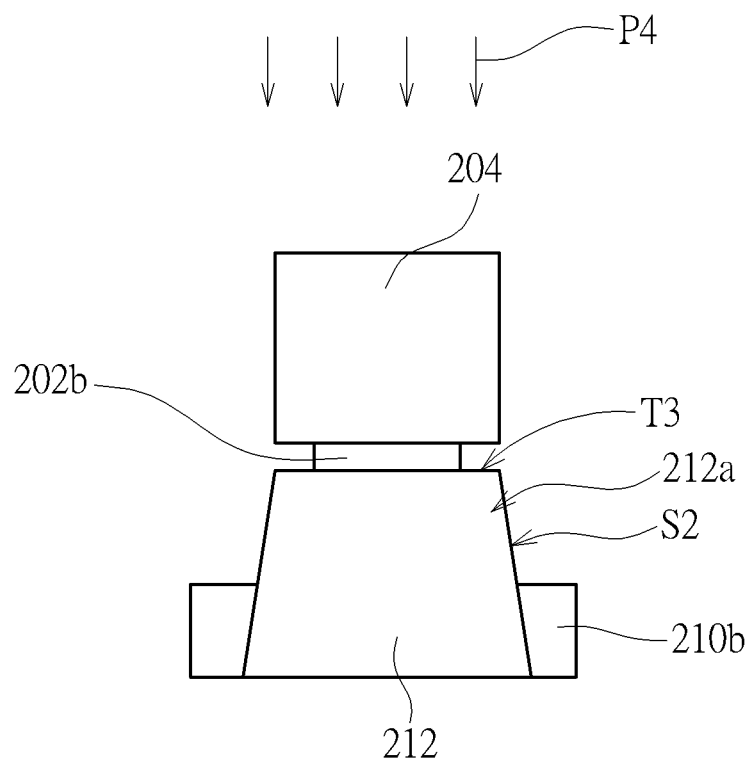

Then, a removing process P4 is performed to remove a top part 210a of the isolation structure 210 and expose a top part 212a of the fin-shaped structure 212 by serving the pad nitride cap 204 as a hard mask, therefore an isolation structure 210b being formed, as shown in FIG. 8. It is emphasized that two ends 202a of the pad oxide cap 202 are removed while the top part 210a of the isolation structure 210 is removed, thereby partial top surfaces T3 and sidewalls S2 of the top part 212a of the fin-shaped structure 212 being exposed, and a pad oxide cap 202b being formed. Preferably, the removing rate of the removing process P4 to the isolation structure 210 and the pad oxide cap 202 is larger than the removing rate of the removing process P4 to the pad nitride cap 204 and the fin-shaped structure 212, to remove the isolation structure 210 and the pad oxide cap 202 but preserve the pad nitride cap 204 and the fin-shaped structure 212. As the isolation structure 210 is a shallow trench isolation (STI) structure, and may include oxide, which may be formed by a shallow trench isolation (STI) process or a flowable chemical vapor deposition (FCVD) process, the isolation structure 210 and the pad oxide cap 202 include common materials. Therefore, the isolation structure 210 and the pad oxide cap 202 can be removed by processes such as a chemical oxide remove process, but it is not limited thereto.

Figure 9:
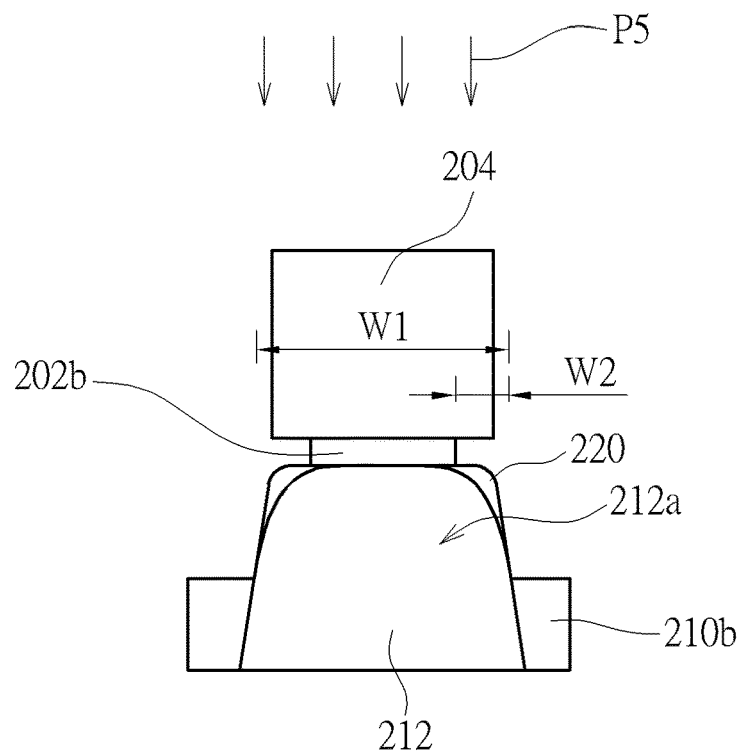

As shown in FIG. 9, an oxidation process P5 is performed to oxidize the partial top surfaces T3 and the sidewalls S2 of the top part 212a of the fin-shaped structure 212, thereby oxidized parts 220 being formed, wherein the oxidized parts 220 not only cover the partial top surfaces T3 but also cover the sidewalls S2 of the top part 212a of the fin-shaped structure 212. Preferably, the ratio of a width w1 of the fin-shaped structure 212 and a width w2 of the oxidized parts 220 is 3-20 to round the fin-shaped structure 212 without consuming the fin-shaped structure 212 too much.

In a preferred embodiment, the oxidation process P5 includes an $O_2$ treatment process or an in situ steam generation (ISSG) process, but it is not limited thereto. In a still preferred embodiment, the oxidation process P5 is an in situ steam generation (ISSG) process for forming the oxidized parts 220 on the partial top surfaces T3 and the sidewalls S2 of the top part 212a of the fin-shaped structure 212 easily.

The thickness of each of the oxidized parts 220 is preferably 7-10 angstroms to round the top part 212a of the fin-shaped structure 212 efficiently.

Figure 10:
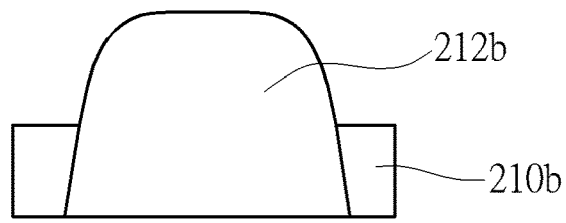

The pad nitride cap 204 is removed by a chemical nitride remove process. Then, the pad oxide cap 202b and the oxidized parts 220 are removed at the same time by a chemical oxide remove process. Thus, rounding fin-shaped structures 212b are formed, as shown in FIG. 10. That is, the oxidized parts 220 round the profile of the fin-shaped structure 212 of FIG. 7. Hence, thicknesses of layers covering the rounding fin-shaped structures 212b such as a gate (especially for a work function metal layer of the gate) in following steps can be uniform. This decreases the tip/point effect and improves device reliability. Thereafter, later processes such as said implantation process, said etching back process, said gate forming process, and etc may be performed.

To summarize, the present invention provides a method of rounding fin-shaped structures, which provides pad oxide caps and pad nitride caps covering fin-shaped structures from bottom to top, fills an isolation structure between the fin-shaped structures, performs a removing process to remove a top part of the isolation structure and expose top parts of the fin-shaped structures, performs an oxidation process to oxidize sidewalls of the top parts of the fin-shaped structures, thereby forming oxidized parts covering the sidewalls of the top parts of the fin-shaped structures, removes the pad nitride caps, and removes the pad oxide caps and the oxidized parts at the same time, thereby rounding the fin-shaped structures. Thus, layers, especially for a work function metal layer, covering the rounding fin-shaped structures can be uniform, hence decreasing the tip/point effect and enhancing device reliability.

Moreover, ends of the pad oxide caps may be removed while the top part of the isolation structure is removed, thereby partial top surfaces and the sidewalls of the top parts of the fin-shaped structures being exposed. Thus, the partial top surfaces and the sidewalls of the top parts of the fin-shaped structures can be oxidized while the oxidation process is performed, thereby the oxidized parts not only covering the partial top surfaces but also covering the sidewalls of the top parts of the fin-shaped structures. Therefore, rounding fin-shaped structures with improved profiles can be formed by the oxidation process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of rounding fin-shaped structures, comprising:
    providing a substrate comprising fin-shaped structures, and pad oxide caps and pad nitride caps stacked from bottom to top covering top surfaces of the fin-shaped structures from bottom to top;
    forming an isolation structure by filling in spaces between the fin-shaped structures;
    performing a removing process to remove a top part of the isolation structure and expose the pad oxide caps, the pad nitride caps and top parts of the fin-shaped structures;
    performing an oxidation process to oxidize sidewalls of the top parts of the fin-shaped structures, thereby forming oxidized parts covering sidewalls of the top parts of the fin-shaped structures;
    removing the pad nitride caps;
    and removing the pad oxide caps and the oxidized parts at the same time, thereby forming rounded fin-shaped structures;
    forming an oxide layer conformally covering the isolation structure and the rounded fin-shaped structures;
    performing an implantation process to form wells in the rounded fin-shaped structures;
    and removing the oxide layer after the implantation process is performed.

2. The method of rounding fin-shaped structures according to claim 1, wherein the isolation structure comprises a shallow trench isolation structure.

3. The method of rounding fin-shaped structures according to claim 1, wherein a top surface of the isolation structure is at a same level with top surfaces of the pad nitride caps after filling the isolation structure.

4. The method of rounding fin-shaped structures according to claim 1, wherein ends of the pad oxide caps are removed while the top part of the isolation structure is removed, thereby exposing a portion of the top and a portion of the sidewalls of the fin-shaped structures.

5. The method of rounding fin-shaped structures according to claim 4, wherein removing rates of the removing process for the isolation structure and the pad oxide caps are larger than removing rates of the removing process for the pad nitride caps and the fin-shaped structures.

6. The method of rounding fin-shaped structures according to claim 5, wherein the isolation structure and the pad oxide caps comprise materials of the same composition.

7. The method of rounding fin-shaped structures according to claim 4, wherein the exposed portions of the top surfaces and sidewalls of the fin-shaped structures are oxidized while the oxidation process is performed, thereby forming oxidized parts covering the exposed portions of the top surfaces of the top parts of the fin-shaped structures.

8. The method of rounding fin-shaped structures according to claim 7, wherein the ratio of a width of the fin-shaped structures and a width of the oxidized parts is 3-20.

9. The method of rounding fin-shaped structures according to claim 1, wherein the step of oxidizing the sidewalls rounds the profile of the fin shape.

10. The method of rounding fin-shaped structures according to claim 1, wherein the oxidation process comprises an O2 treatment process or an in situ steam generation (ISSG) process.

11. The method of rounding fin-shaped structures according to claim 1, wherein the thickness of each oxidized part is 7-10 angstroms.

12. The method of rounding fin-shaped structures according to claim 1, wherein the oxide layer is formed by an atomic layer deposition process.

13. The method of rounding fin-shaped structures according to claim 1, further comprising: etching back the isolation structure and forming a gate over the rounded fin-shaped structures after the oxide layer is removed.

* * * * *